(12) United States Patent
Roy et al.

(10) Patent No.: US 8,791,512 B2
(45) Date of Patent: Jul. 29, 2014

(54) MATRIX IMAGING DEVICE HAVING PHOTOSITES WITH GLOBAL SHUTTER CHARGE TRANSFER

(75) Inventors: Francois Roy, Seyssins (FR); Julien Michelot, Grenoble (FR)

(73) Assignees: STMicroelectronics (Crolles 2) SAS, Crolles Cedex (FR);
STMicroelectronics SA, Montrouge (FR)

(*) Notice: Subject to any disclaimer, the term of this patent is extended or adjusted under 35 U.S.C. 154(b) by 130 days.

(21) Appl. No.: 13/241,666

(22) Filed: Sep. 23, 2011

(65) Prior Publication Data

US 2012/0161213 A1 Jun. 28, 2012

(30) Foreign Application Priority Data

Dec. 23, 2010 (FR) ...................................... 10 61198

(51) Int. Cl.
*H01L 31/113* (2006.01)

(52) U.S. Cl.
USPC ........... 257/291; 257/292; 257/230; 257/445; 257/446; 257/301; 257/E31.054; 257/E27.016; 257/E21.646; 250/208.1

(58) Field of Classification Search
USPC ........... 250/208.1, 214.2; 257/291, 292, 230, 257/445, 446, 301, E31.054, E27.016, 257/E21.646, 355, 219, 3, E31.082, 257/E31.113, E27.129
See application file for complete search history.

(56) References Cited

U.S. PATENT DOCUMENTS

| | | | | |
|---|---|---|---|---|
| 4,808,834 A * | 2/1989 | Kimata | ...................... | 250/208.1 |
| 5,410,175 A * | 4/1995 | Kyomasu et al. | ............. | 257/458 |
| 5,656,848 A * | 8/1997 | Beratan et al. | ................ | 257/446 |
| 5,825,071 A * | 10/1998 | Takakura | ....................... | 257/440 |
| 5,994,771 A * | 11/1999 | Sasaki et al. | ................... | 257/700 |
| 6,051,857 A * | 4/2000 | Miida | ........................... | 257/292 |
| 6,177,333 B1 * | 1/2001 | Rhodes | ......................... | 438/433 |
| 7,250,321 B2 * | 7/2007 | Rhodes | ........................... | 438/48 |
| 7,586,170 B2 * | 9/2009 | Kwon et al. | ................... | 257/446 |
| 7,759,698 B2 * | 7/2010 | Ogura | ........................... | 257/185 |
| 7,772,027 B2 * | 8/2010 | Rhodes et al. | .................... | 438/73 |
| 8,440,490 B2 * | 5/2013 | Adkisson et al. | ................ | 438/57 |

(Continued)

FOREIGN PATENT DOCUMENTS

| | | |
|---|---|---|
| EP | 2216817 A1 | 8/2010 |
| FR | 2930676 A1 | 10/2009 |
| JP | 2006147758 A | 6/2006 |

OTHER PUBLICATIONS

French Search Report mailed Jun. 29, 2011 for FR 1061198 (2 pages).

*Primary Examiner* — Michael Shingleton
(74) *Attorney, Agent, or Firm* — Gardere Wynne Sewell LLP

(57) ABSTRACT

An imaging device is formed in a semiconductor substrate. The device includes a matrix array of photosites. Each photosite is formed of a semiconductor region for storing charge, a semiconductor region for reading charge specific to said photosite, and a charge transfer circuit configured so as to permit a transfer of charge between the charge storage region and the charge reading region. Each photosite further includes at least one buried first electrode. At least one part of that buried first electrode bounds at least one part of the charge storage region. The charge transfer circuit for each photosite includes at least one second buried electrode.

22 Claims, 8 Drawing Sheets

(56) References Cited

U.S. PATENT DOCUMENTS

| | | | |
|---|---|---|---|
| 2003/0089929 A1* | 5/2003 | Rhodes | 257/219 |
| 2003/0168701 A1* | 9/2003 | Voldman | 257/355 |
| 2005/0285165 A1* | 12/2005 | Ohkawa et al. | 257/292 |
| 2006/0043437 A1* | 3/2006 | Mouli | 257/291 |
| 2006/0081887 A1* | 4/2006 | Lyu | 257/215 |
| 2007/0158713 A1* | 7/2007 | Ohkawa | 257/292 |
| 2007/0272958 A1* | 11/2007 | Misaki et al. | 257/291 |
| 2008/0283881 A1* | 11/2008 | Lee | 257/292 |
| 2009/0266973 A1* | 10/2009 | Roy et al. | 250/206 |
| 2010/0127314 A1* | 5/2010 | Frach | 257/292 |
| 2010/0148040 A1* | 6/2010 | Sanfilippo et al. | 250/214.1 |
| 2011/0169065 A1* | 7/2011 | Cheng et al. | 257/301 |
| 2012/0025288 A1* | 2/2012 | Doris et al. | 257/301 |
| 2012/0122261 A1* | 5/2012 | Adkisson et al. | 438/57 |
| 2012/0161213 A1* | 6/2012 | Roy et al. | 257/292 |
| 2012/0205732 A1* | 8/2012 | Barth et al. | 257/301 |
| 2012/0235212 A1* | 9/2012 | Chen et al. | 257/223 |
| 2012/0248522 A1* | 10/2012 | Goyal et al. | 257/301 |
| 2012/0267697 A1* | 10/2012 | Erickson et al. | 257/301 |
| 2013/0134491 A1* | 5/2013 | Messenger et al. | 257/301 |

* cited by examiner

MATRIX IMAGING DEVICE HAVING PHOTOSITES WITH GLOBAL SHUTTER CHARGE TRANSFER

PRIORITY CLAIM

This application claims priority from French Application for Patent No. 1061198 filed Dec. 23, 2010, the disclosure of which is hereby incorporated by reference.

TECHNICAL FIELD

The invention relates to imaging devices, especially devices comprising a matrix array of photosites, and more particularly to grouped control of the reading of the photosites.

BACKGROUND

An imaging device, or sensor, is a photosensitive electronic component used to convert electromagnetic radiation into an analog electrical signal. This signal is then amplified then digitized using an analog-to-digital converter and finally processed so as to obtain a digital image.

Imaging devices make use of the photoelectric effect whereby incident photons tear electrons from atoms in each active element. An imaging device generally comprises photosites arranged in a matrix, each photosite corresponding to a pixel of an image.

A photosite comprises at least one photosensitive region, especially a photodiode, and a region for reading charge accumulated in the photodiode. Photons captured by a photodiode of a photosite are converted into electron/hole pairs. Charge of the first type, for example holes, created in the photosensitive regions, is stored in the photosite before being read by virtue of an electronic system, while charge of the second type, for example electrons, is drained into $n^+$-type drain regions.

Generally this electronic system, which controls the photodiode, comprises, especially when the photodiode is a fully depleted photodiode, a transfer transistor permitting the transfer of charge stored in the photodiode to a charge reading region. This charge reading region forms a sensing node to which conventional control electronics are connected, especially comprising a read transistor.

A photodiode operates according to a cycle comprising at least an integration step, a sensing step and a reset step. The integration step corresponds to the photogeneration and accumulation of charge during exposure of the photodiode. The sensing step corresponds to the generation of a signal depending on the amount of photogenerated charge accumulated in the photodiode. The reset step corresponds to the removal of the photogenerated charge.

To produce a global shutter the photosites of an imaging device are produced in the conventional way, four transistors being associated with a photodiode; however, the electronic system of each photosite is made more complex, especially by the addition of a fifth transistor.

Moreover, it is known from the article by M. Funaki et al. entitled "New Global Shutter CMOS Imager with 2 Transistors per Pixel" published in "2008 Symposium on VLSI Technology Digest of Technical Papers" to produce photosites using only two transistors, the first transistor controlling charge transfer and the second transistor controlling reading of the signal. The signal delivered by this read transistor is modulated by the charge transferred and stored in its own body (charge modulation device).

However, in such a photosite, the charge is surface transferred, and the read electronics, especially comprising a charge transfer transistor and means for reading charge, is placed mainly on the surface of the photosite occupying most of its useful area and consequently reducing the area of the photosensitive region of the photodiode within the photosite.

SUMMARY

According to one embodiment, an imaging device is provided comprising photosites the photosensitive regions of which are maximized and for which it is possible to produce a global shutter for the transfer and reading of charge.

According to one aspect, an imaging device is provided formed in a semiconductor substrate comprising a matrix array of photosites, each photosite comprising a semiconductor region for storing charge, a semiconductor charge reading region specific to said photosite, and means for transferring charge configured so as to permit a transfer of charge between the charge storage region and the charge reading region.

According to a general feature of this aspect, each photosite comprises at least one buried first electrode at least one part of which bounds at least one part of said charge storage region, and the means for transferring charge of each photosite comprise at least one second buried electrode.

The buried electrodes enable an electrostatic potential well to be formed which ensures confinement of charge deep in the substrate of the photosite and thus allows the charge confinement volume to be increased relative to the limited confinement volume available at the surface of the photosite. Moreover, the electrode having at least one part bounding at least one part of the photosensitive region makes it possible to enlarge the charge collection region, i.e. the region for collecting holes using an electrostatic effect.

Preferably, the charge storage region of each photosite has the same conductivity type as that of the semiconductor substrate and of the charge reading region, the doping level of the charge storage region being higher than the doping level of the semiconductor substrate and lower than the doping level of the charge reading region.

The reading region has a volume that is smaller than the volume of the charge storage region. By doping the reading region more highly than the charge storage region it is possible to store the same amount of charge in the reading region as in the charge storage region.

By creating and controlling potential wells and potential barriers, it is possible to transfer charge that is initially stored in the charge storage region to the charge reading region. Advantageously, each photosite comprises, within the substrate, a doped main layer having the same conductivity type as that of the substrate and located beneath a surface layer of opposite conductivity type, the surface layer and the main layer forming a photodiode, and part of the main layer forming the charge storage region.

Specifically, the p-n junction thus formed by this surface layer superposed on the main layer forms a photodiode capable of converting incident photons into photocarriers via the photoelectric effect. Part of the main layer forms the charge storage region of the photodiode.

Each photosite preferably comprises reading means able to sense charge in the reading region and transmit a corresponding signal.

Preferably the device comprises a control gate placed on the charge reading region. This control gate makes it possible to select the photosite to be read and to control the reading of the voltage corresponding to the amount of charge transferred to the reading region.

In addition, the reading means preferably comprise a transistor having a modulatable threshold voltage in which the reading region forms the body of said transistor, the control gate forms the gate of said transistor, a first portion of the surface layer forms the source of said transistor and a second portion of the surface layer forms the drain of said transistor, the first and second portions of the surface layer being separated by the reading region, and the second portion of the surface layer extending along the photodiode.

The source voltage of the transistor having a modulatable threshold voltage is measured during the read operation. This source voltage is an image of the voltage in the body of said transistor, the voltage in the body being proportional to the number of charges in the body.

Advantageously, the transfer means of the photosites of the matrix array may be coupled together.

It is thus possible to produce a global shutter of the charge transfer for all the photosites of the matrix array of the imaging device.

Likewise, the charge-modulation means of the photosites in a given row of the matrix array may advantageously be coupled together.

It is thus possible to produce a global shutter for the read operation of photosites in a given row of a matrix array.

The charge transfer means may advantageously be electrostatically coupled to the reading region.

Advantageously, the width of the reading region of a photosite is defined by at least one buried electrode. The width of the reading region of a photosite may thus be defined by the first buried electrode, the confinement electrode, the second buried electrode, the transfer electrode or indeed an additional buried electrode, or one or more of these electrodes in combination.

Advantageously, the reading region of a photosite is isolated from neighbouring photosites by at least one buried electrode. Thus, the reading region of a photosite may be isolated from other photosites by the first buried electrode, the confinement electrode, the second buried electrode, the transfer electrode, or indeed an additional buried electrode, or one or more of these electrodes in combination.

BRIEF DESCRIPTION OF THE DRAWINGS

Other advantages and features of the invention will become clear on examining the detailed description of non-limiting embodiments, and the appended drawings in which.

DETAILED DESCRIPTION OF THE DRAWINGS

Figure 1:
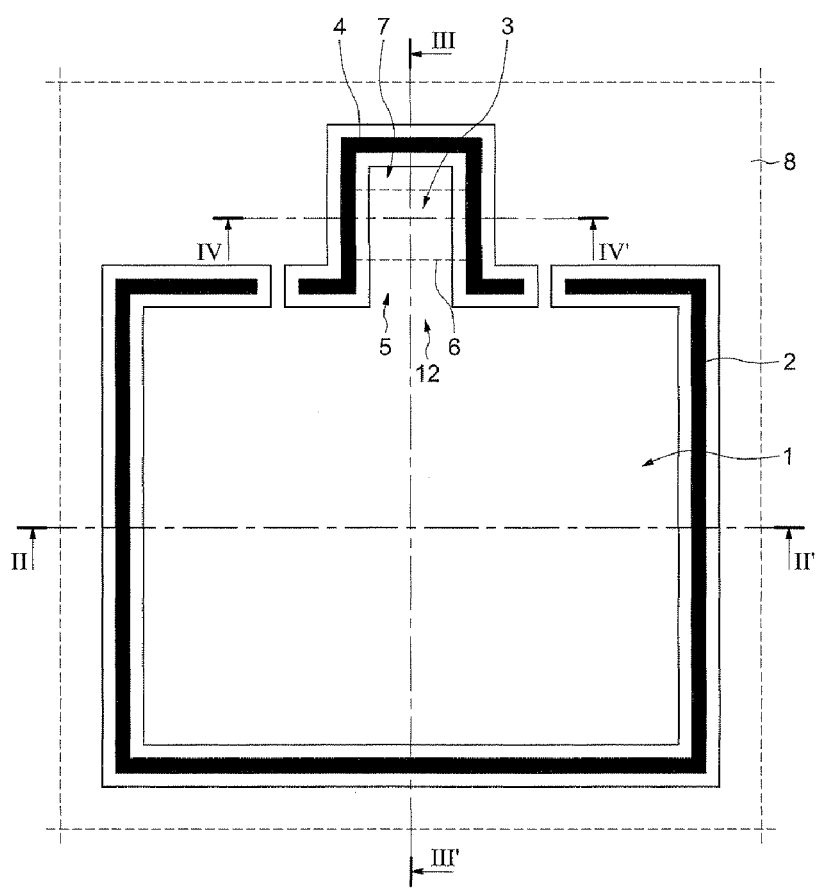
FIG. 1 shows schematically a photosite of an imaging device according to a first embodiment.

FIG. 1 shows schematically a photosite of an imaging device according to a first embodiment. The schematic representation corresponds to a top view of the photosite.

The photosite comprises a photosensitive region 1 bounded at least partly by a main electrode 2, and a charge reading region 3, bounded at least partly by a charge transfer electrode 4.

In this embodiment, the main electrode 2 may comprise one or more electrodes. Likewise, the charge transfer electrode 4 may comprise one or more electrodes.

The main electrode 2 is arranged so as to bound the photosensitive region 1 except in a charge transfer region 5 bounded by the charge transfer electrode 4. The charge transfer region 5 corresponds to the part of the photosensitive region adjacent to the reading region 3 and lies between two portions of the charge transfer electrode 4.

The main electrode 2 and the charge transfer electrode 4 thus form a virtually closed assembly.

On the reading region 3 there is, shown by the dashed lines, a control gate 6 that makes it possible to select the photosite to be read and to control the reading of said photosite.

Figure 3:
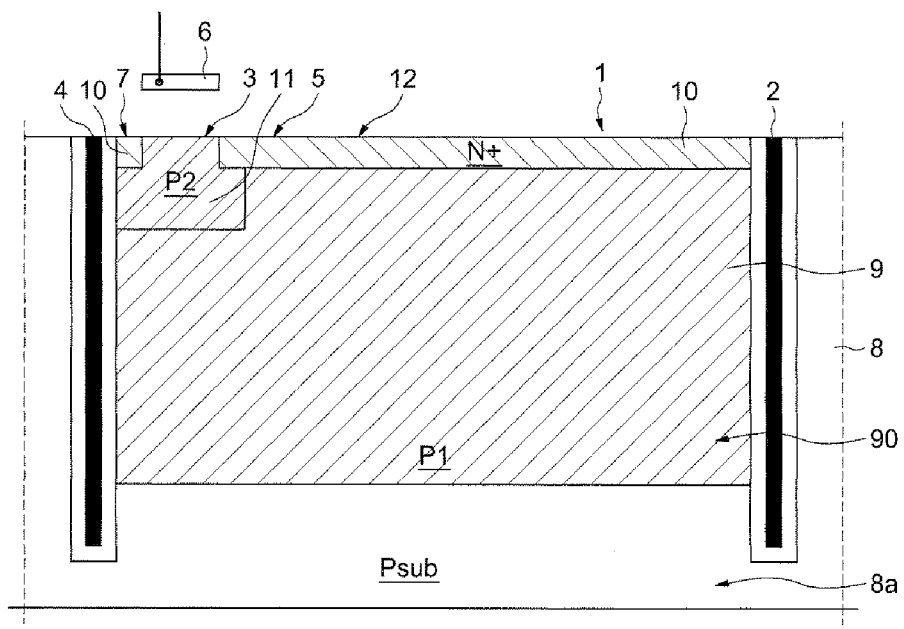

The control gate is also shown in FIG. 3.

Figure 2:
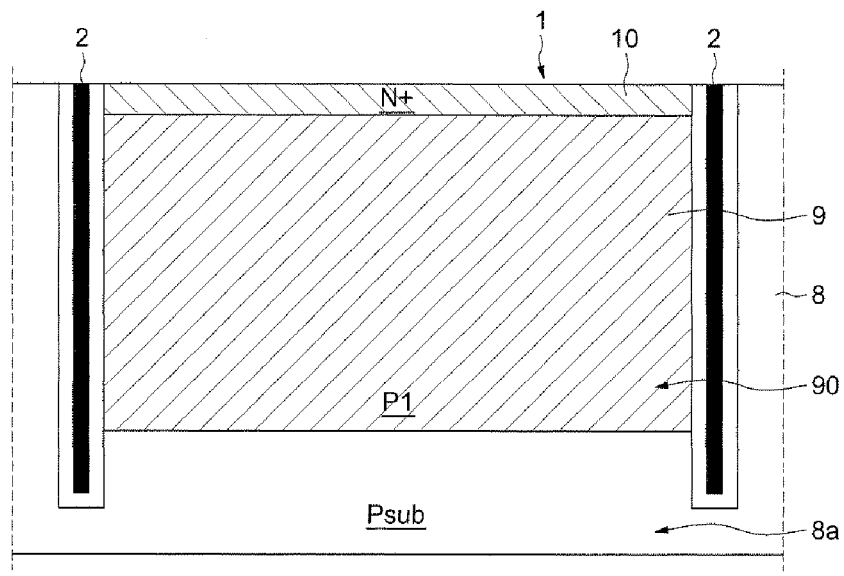
FIGS. 2 to 4 illustrate cross sections through the photosite in FIG. 1 along the planes II-II', III-III' and IV-IV', respectively.

FIG. 2 shows a view in cross section of the photosite in FIG. 1 along the plane II-II' transecting the photosensitive region 1.

The photosite is produced in a substrate 8 doped p-type to a first doping level Psub. Two portions of the main electrode 2 buried in the substrate 8 bound the photosensitive region 1.

The main electrode 2 comprises an electrically conductive gate buried depthwise in the substrate 8 and isolated from the substrate 8.

The photosensitive region 1 comprises a main layer 9 doped p-type to a second doping level P1 higher than the doping level Psub of the substrate 8. The main layer 9 is implanted in the semiconductor substrate 8 so as to be superposed on a lower layer of the substrate 8a. The photosensitive region 1 also comprises a surface layer 10 doped n-type, implanted in the substrate 8 at the surface, so as to be superposed on the main layer 9.

Superposition of the n-type surface layer 10 on the p-type main layer 9 forms a photodiode comprising a p-n junction, a portion of the main layer 9 forming the charge storage region 90. Specifically, it is in this portion of the p-type main layer 9, lying between the n-type surface layer 10 and the substrate layer 8a, doped p-type to a level Psub lower than the doping level P1 of the main layer 9, that the charge created via the photoelectric effect is stored.

FIG. 3 shows a view in cross section of the photosite in FIG. 1 along the plane III-III' transecting both the charge reading region 3 and the photosensitive region 1.

In FIG. 3 the photosensitive region 1 may be seen, produced in the substrate 8, bounded in part by the main electrode 2. The photosensitive region 1 is also bounded by the reading region 3, comprising a semiconductor body 11 implanted in the p-type doped main layer 9 doped to a third doping level P2 higher than the second doping level P1 of the main layer 9. This body 11 is coupled electrostatically to the transfer electrode 4.

The portion of the main layer 9 located beneath the semiconductor body 11 of the reading region 3 is not part of the charge storage region 90.

The body 11 of the charge reading region 3 is intended to receive charge transferred from the charge storage region 90 by the charge transfer electrode 4. The body 11 is electrically floating, in contrast to a conventional transistor the body of which is biased to a voltage. The body 11 of the transistor being floating, the intrinsic bias voltage may thus be modified as a function of the voltage applied to the transfer electrode 4. The intrinsic bias voltage of the body may thus be coupled to the transfer electrode 4, this coupling promoting charge transfer from the charge storage region 90 to the reading region 3, where a potential well enables charge storage in the reading region 3.

The gate 6 for controlling the means for reading charge photogenerated in this site is placed on the body 11 of the reading region 3.

The imaging device comprises means for reading charge comprising a transistor having a modulatable threshold voltage.

As illustrated in FIGS. 1 and 3, the body 11 of the charge reading region 3 forms the body of the transistor having a modulatable threshold voltage, the control gate 6 forming the gate of the transistor, a first portion 7 of the surface layer 10 forming the source of the transistor, and a second portion 12 of the surface layer 10 forming the drain of the transistor.

The first portion 7 of the surface layer 10 corresponds to the surface layer 10 lying between the charge transfer electrode 4 and the exposed surface part of the charge reading region 3. The source of the transistor formed by this first portion 7 is connected to the corresponding column of the matrix array.

The second portion 12 of the surface layer 10 corresponds to the surface layer 10 lying between the main electrode 2 and the exposed surface part of the charge reading region 3. The drain of the transistor having a modulatable threshold voltage thus lies above the photosensitive region 1 and sets the reference voltage of the photodiode.

In operation, the photosite captures photons in the photosensitive region 1 and stores the holes generated by the photoelectric effect in the charge storage region 90 of the photosensitive region 1 before transferring this charge, using the charge transfer electrode 4, to the charge reading region 3. Once the transfer has finished, so as to sense the amount of charge transferred, a read operation activation voltage is applied to the control gate 6. The read operation is then carried out by sensing the voltage of the source of the transistor having a modulatable threshold voltage, i.e. the first portion 7, the voltage of the source region being an image of the voltage of the reading region 3, the voltage of the reading region 3 being defined by the amount of charge transferred to the reading region 3.

Figure 4:
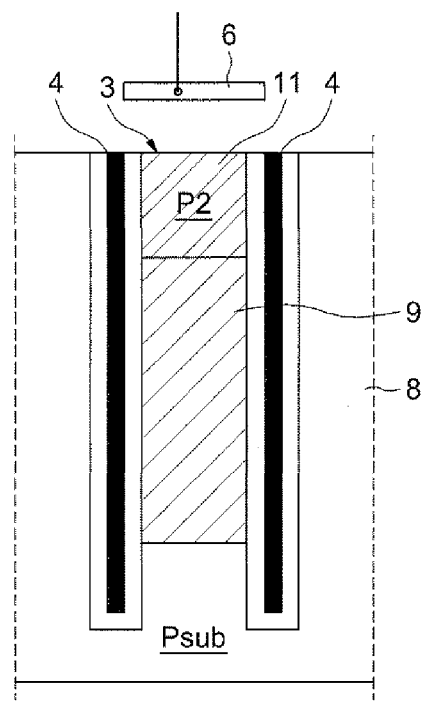

FIG. 4 show a view in cross section of the photosite in FIG. 1 along the plane IV-IV' transecting the reading region 3.

As illustrated in FIG. 4, the semiconductor body 11 of the reading region 3 lies between two portions of the charge transfer electrode 4 and superposed on the main semiconductor layer 9. The electrical potential or lack of electrical potential applied to the charge transfer electrode 4 makes it possible to modify the intrinsic potential of the body 11 and to permit or inhibit transfer of charge between the charge storage region 90 and the charge reading region 3.

Figure 5:
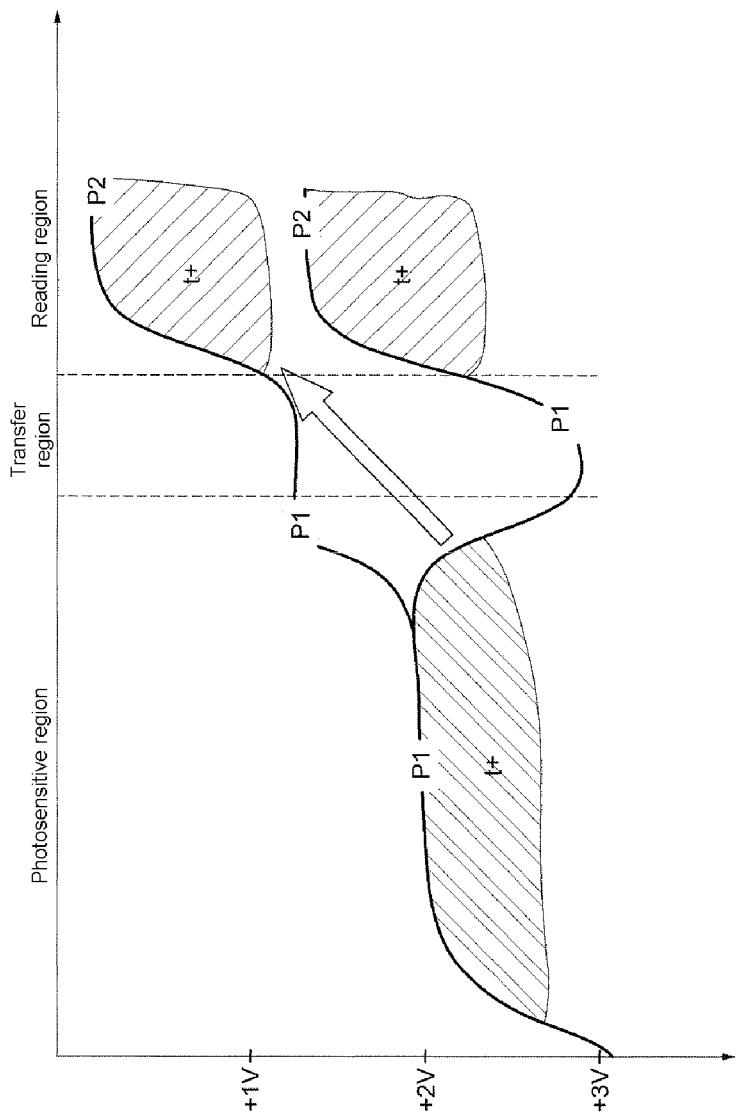
FIG. 5 shows an exemplary potential curve for a photosite of an imaging device in a section plane III-III' for the first embodiment.

FIG. 5 shows an exemplary potential curve for a photosite of an imaging device in a section plane III-III' for the first embodiment.

As illustrated, under charge accumulation conditions, a first voltage is applied to the transfer electrode 4 so as to create a potential barrier preventing any flow of charge between the photosensitive region 1 and the reading region 3. The potential well created by the bias on the main electrode 2 and the doping P1 of the main layer 9 makes it possible to store the holes created via the photoelectric effect by incident photons.

During the transfer, a second potential is applied to the transfer electrode 4 so as to eliminate the potential barrier and modify the intrinsic potential of the reading region 3. The intrinsic potential of the reading region 3 is modified so as to create a potential well that is deeper than the potential well in the photosensitive region 1. Thus it is possible to transfer holes from the photosensitive region 1 to the reading region 3.

By reapplying the first voltage to the transfer electrode 4, the potential barrier is again created and the intrinsic potential of the reading region 3 is again modified. However, the reading region now contains charge, the bias voltage intrinsic to the reading region being different from the intrinsic bias voltage when the reading region 3 is empty.

The image of this bias voltage difference is then read on the source of the transistor having a modulatable threshold voltage of the reading means.

Figure 6:
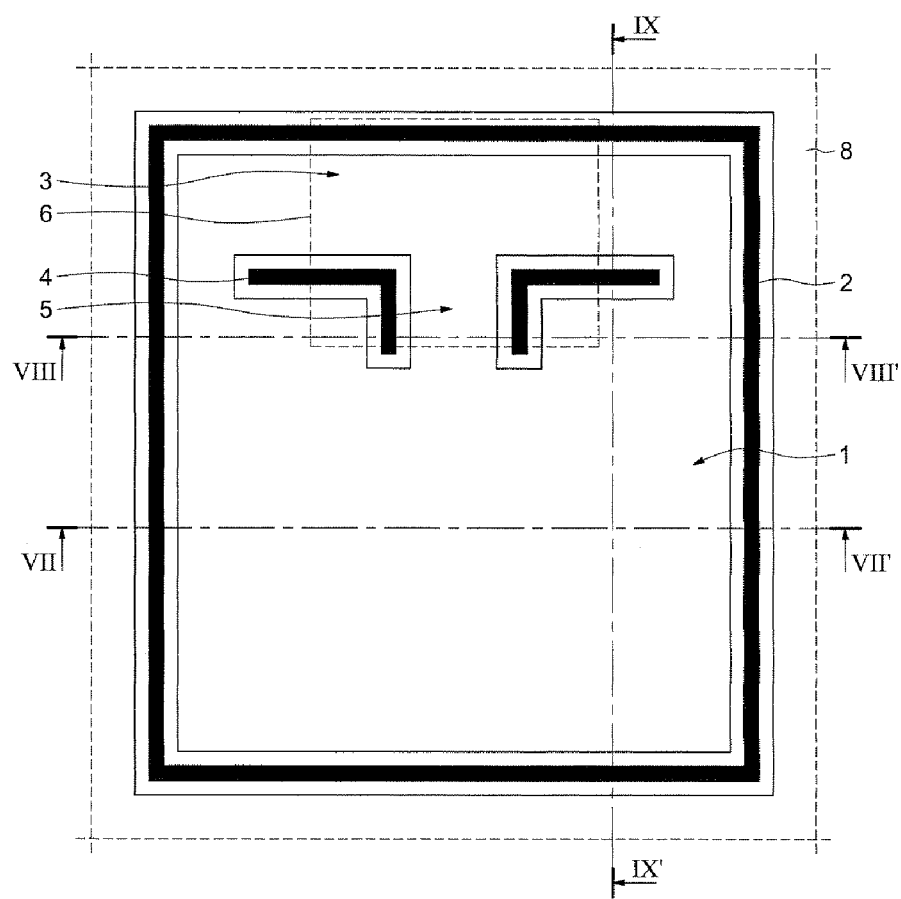
FIG. 6 shows schematically a photosite of an imaging device according to a second embodiment.

FIG. 6 shows schematically a photosite of an imaging device according to a second embodiment. The schematic representation corresponds to a top view of the photosite.

Elements given the same references as the elements in FIGS. 1 to 4 are similar.

In this second embodiment, the photosite thus comprises a photosensitive region 1 bounded, on the one hand, by a first part of a main electrode 2 and, on the other hand, by means for transferring charge formed by a pair of charge transfer electrodes 4, and a charge reading region 3 bounded by the charge transfer electrode 4, on the one hand, and by a second part of the main electrode 2, on the other.

In this second embodiment, the main electrode 2 may also comprise one or more electrodes. The main electrode 2 is shaped so as to bound both the photosensitive region 1 and the charge reading region 3. The pair of charge transfer electrodes 4 are coupled to each other and are located inside the region bounded by the main electrode 2.

The charge transfer region 5 corresponds to part of the photosensitive region 1 adjacent to the reading region 3 and lying between the pair of charge transfer electrodes 4.

The control gate 6 of the reading means based on the modulation of the threshold voltage induced by photogenerated charge in the photosite is shown by dotted lines on the reading region 3.

Figure 7:
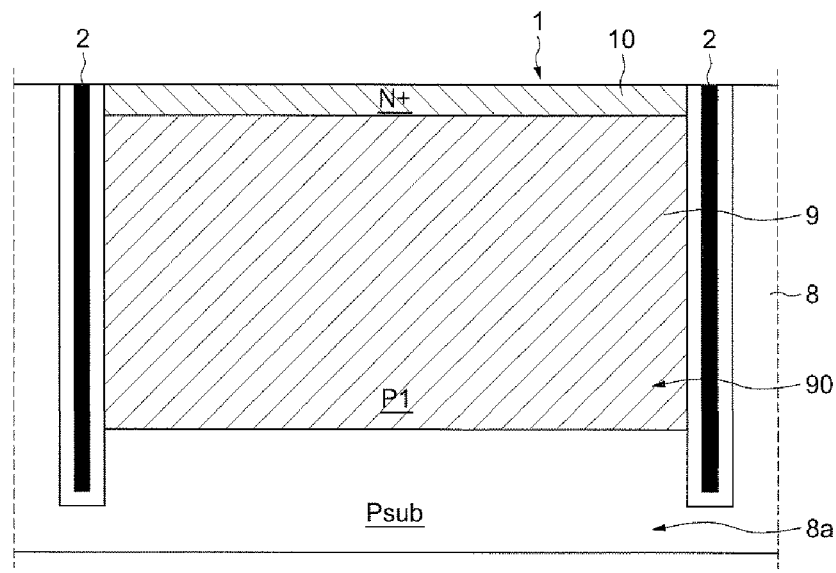
FIGS. 7 to 9 illustrate cross-sectional views of the photosite in FIG. 6, along the planes VII-VII', VIII-VIII' and IX-IX', respectively.

FIG. 7 shows a view in cross section of the photosite in FIG. 6 along the plane VII-VII' transecting the photosensitive region 1.

The cross section in the plane VII-VII' of the photosite according to the second embodiment is identical to the cross section in the plane II-II' of the photosite according to the first embodiment.

Figure 8:
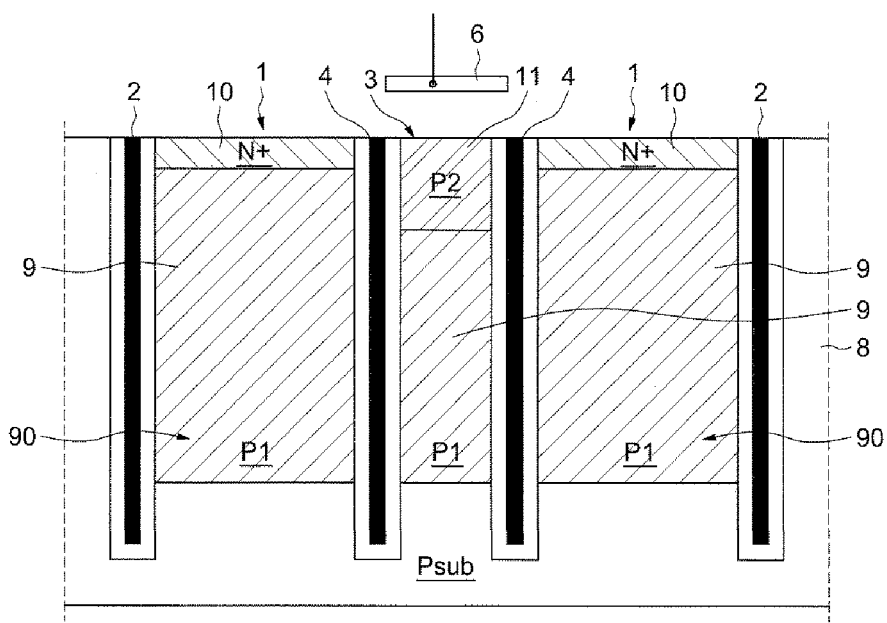

FIG. 8 shows a view in cross section of the photosite of FIG. 6 along the plane VIII-VIII' transecting both the charge reading region 3 and the photosensitive region 1.

As illustrated in this figure, the portions of the photosensitive region 1 produced in the substrate 8 are bounded by the main electrode 2 and by the transfer electrodes 4.

The reading region 3 comprises a semiconductor body 11 implanted in the p-type doped first layer 9 doped to a third doping level P2 higher than the second doping level P1 of the first layer 9. The body 11 of the reading region 3 is bounded in this cross section by the two charge transfer electrodes 4.

The control gate 6 of the reading means able to read the modulation of voltage of the body 11 is placed on the reading region 3.

Figure 9:
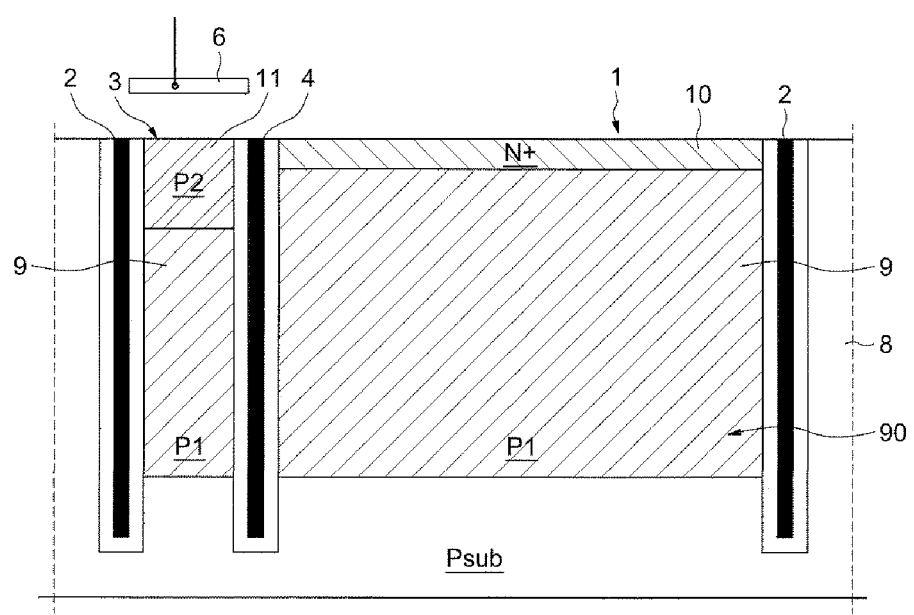

FIG. 9 shows a view in cross section of the photosite in FIG. 6 along the plane IX-IX' transecting the reading region 3 and the photosensitive region 1.

As illustrated in this FIG. 9, the semiconductor body 11 of the reading region 3 lies between a charge transfer electrode 4 and the main electrode 2, and is superposed on the main semiconductor layer 9. The electrical potential or lack of electrical potential applied to the pair of charge transfer electrodes 4 makes it possible to permit or inhibit transfer of charge between the charge storage region 90 and the charge reading region 3.

Figure 10:
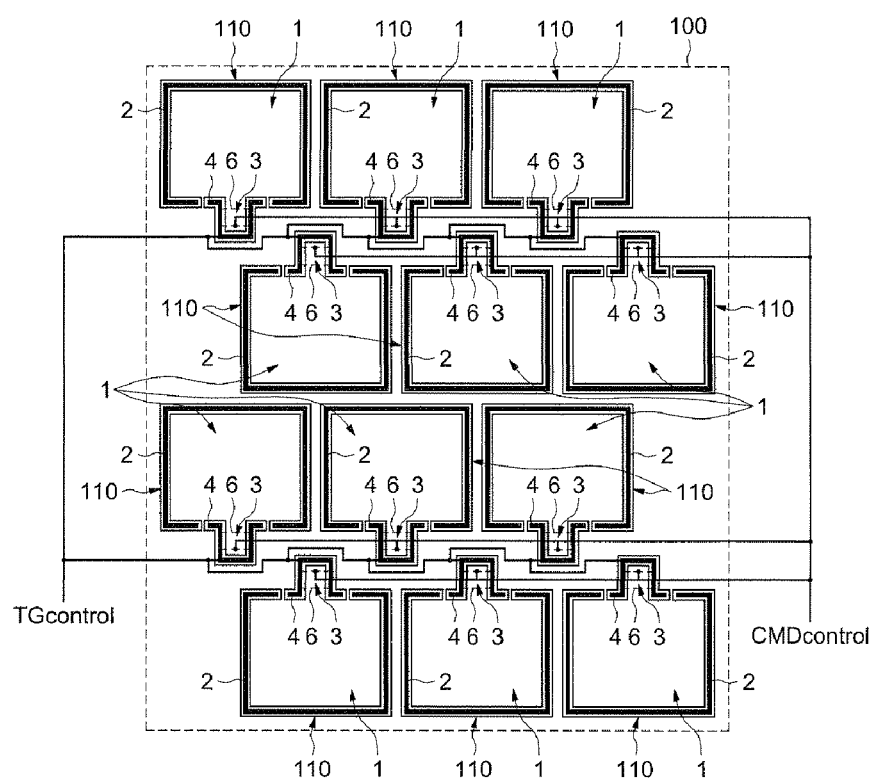
FIG. 10 shows schematically an exemplary matrix imaging device with photosites having global shutter charge transfer.

FIG. 10 shows schematically an exemplary matrix imaging device 100 having photosites 110 with global shutter charge transfer.

The imaging device 100 comprises a plurality of photosites 110 organised in a matrix. In this example, each photosite 110 is produced according to the first embodiment illustrated in FIG. 1.

The charge transfer electrodes 4 of the photosites 110 are coupled together electrically so that the transfer of charge from each photosite is controlled simultaneously by a transfer control means TGcontrol.

In the same way, the control gates 6 of the photosites 110 are coupled together electrically so that the amount of charge in each photosite is sensed sequentially via a means for controlling selection of the photosite CMDcontrol.

What is claimed is:

1. An imaging device formed in a semiconductor substrate comprising a matrix array of photosites, each photosite comprising:
    a first semiconductor region for storing charge,
    a second semiconductor region for reading charge specific to said photosite, and
    a charge transfer circuit configured to permit a transfer of charge between the first semiconductor region for storing charge and the second semiconductor region for reading charge,
    wherein each photosite further comprises at least one buried first electrode having at least one part of which that bounds at least one part of said first semiconductor region for storing charge, and
    wherein the charge transfer circuit at each photosite comprises at least one second buried electrode that bounds at least one part of said second semiconductor region for reading charge, and
    a reading circuit comprising a control gate electrode positioned above a top surface of the semiconductor substrate at a location over and separated from the second semiconductor region for reading charge.

2. The device according to claim 1, wherein the first semiconductor region for storing charge of each photosite has a same conductivity type as that of the semiconductor substrate and of the second semiconductor region for reading charge,
    wherein a doping level of the first semiconductor region for storing charge is higher than a doping level of the semiconductor substrate and further is lower than a doping level of the second semiconductor region for reading charge.

3. The device according to claim 1, wherein each photosite comprises, within the substrate, a doped main layer having the same conductivity type as that of the substrate and located beneath a surface layer of opposite conductivity type, the surface layer and the main layer forming a photodiode, and wherein part of the main layer forms the first semiconductor region for storing charge.

4. The device according to claim 1, wherein each reading circuit is configured to sense an amount of charge in the second semiconductor region for reading and transmit a corresponding signal.

5. The device according to claim 3, wherein the reading circuit comprises a transistor having a modulatable threshold voltage in which the second semiconductor region for reading forms a body of said transistor, the control gate electrode forms a gate of said transistor, a first portion of the surface layer forms a source of said transistor and a second portion of the surface layer forms a drain of said transistor, the first and second portions of the surface layer being separated by the second semiconductor region for reading, and the second portion of the surface layer extending along the photodiode.

6. The device according to claim 1, wherein the charge transfer circuit for each of the photosites of the matrix array are coupled together.

7. The device according to claim 6, wherein the reading circuit for each of the photosites in a given row of the matrix array are coupled together.

8. The device according to claim 1, wherein the charge transfer circuit is electrostatically coupled to the second semiconductor region for reading charge.

9. The device according to claim 1, wherein a width of the second semiconductor region for reading charge of a photosite is defined by at least one buried electrode.

10. The device according to claim 1, wherein the second semiconductor region for reading charge of a photosite is isolated from neighboring photosites by at least one buried electrode.

11. An imaging photosite formed in a semiconductor substrate comprising, comprising:
    a first semiconductor region for storing charge,
    a second semiconductor region for reading charge,
    a first electrode formed in the substrate and at least substantially surrounding said first semiconductor region for storing charge,
    a second electrode formed in the substrate and at least substantially surrounding said second semiconductor region for reading charge, and
    a charge transfer circuit configured to control transfer of charge between the first semiconductor region for storing charge and the second semiconductor region for reading charge, wherein the charge transfer circuit is electrostatically coupled to the second semiconductor region for reading charge.

12. The photosite according to claim 11, wherein the first semiconductor region for storing charge has a same conductivity type as that of the semiconductor substrate and of the second semiconductor region for reading charge,
    wherein a doping level of the first semiconductor region for storing charge is higher than a doping level of the semiconductor substrate and further is lower than a doping level of the second semiconductor region for reading charge.

13. The photosite according to claim 11, wherein each photosite comprises a reading circuit configured to sense an amount of charge in the second semiconductor region for reading and transmit a corresponding signal.

14. An imaging photosite formed in a semiconductor substrate comprising, comprising:
    a first semiconductor region for storing charge,
    a second semiconductor region for reading charge,
    a first electrode formed in the substrate and at least substantially surrounding said first semiconductor region for storing charge,
    a second electrode formed in the substrate and at least substantially surrounding said second semiconductor region for reading charge, and
    a charge transfer circuit configured to control transfer of charge between the first semiconductor region for storing charge and the second semiconductor region for reading charge;
    wherein the first semiconductor region for storing charge has a same conductivity type as that of the semiconductor substrate and of the second semiconductor region for reading charge, and
    wherein a doping level of the first semiconductor region for storing charge is higher than a doping level of the semiconductor substrate and further is lower than a doping level of the second semiconductor region for reading charge.

15. The photosite according to claim 14, wherein each photosite comprises a reading circuit configured to sense an amount of charge in the second semiconductor region for reading and transmit a corresponding signal.

16. An imaging photosite formed in a semiconductor substrate comprising, comprising:
   a first semiconductor region for storing charge,
   a second semiconductor region for reading charge located adjacent the first semiconductor region,
   an electrode structure formed in the substrate comprising:
      a first electrode segment that substantially surrounds said first semiconductor region on at least three sides, and
      a second electrode segment, disconnected from said first electrode segment, that substantially surrounds said second semiconductor region on at least three sides, and
   a gate electrode positioned above a top surface of the semiconductor substrate at a location over and separated from the second semiconductor region for reading charge, the gate electrode defining a gate of a transistor having a body region formed by the second semiconductor region.

17. The photosite according to claim 16, wherein the first semiconductor region for storing charge has a same conductivity type as that of the semiconductor substrate and of the second semiconductor region for reading charge,
   wherein a doping level of the first semiconductor region for storing charge is higher than a doping level of the semiconductor substrate and further is lower than a doping level of the second semiconductor region for reading charge.

18. The photosite according to claim 16, wherein each photosite comprises a reading circuit configured to sense an amount of charge in the second semiconductor region for reading and transmit a corresponding signal, and wherein the charge transfer circuit is electrostatically coupled to the second semiconductor region for reading charge.

19. The photosite according to claim 16, wherein a fourth side of the first semiconductor region and a fourth side of the second semiconductor region face each other, and wherein portions of both the first and second electrode segments extend along the fourth side of the first semiconductor region.

20. The photosite according to claim 16, wherein the first electrode segment defines a first rectangular region for the first semiconductor region and the second electrode segment defines a second rectangular region for the second semiconductor region, the first and second rectangular regions have an edge portion not surrounded by the electrode structure and which face each other.

21. The photosite according to claim 16, wherein a first end of the first electrode segment is aligned with and adjacent to a first end of the second electrode segment, and wherein a second end of the first electrode segment is aligned with and adjacent to a second end of the second electrode segment.

22. The photosite according to claim 16, wherein said first semiconductor region for storing charge has a first conductivity, further comprising a surface layer of a second, opposite, conductivity overlying said first semiconductor region for storing charge, and wherein said transistor further comprises a source region and a drain region formed from said surface layer.

* * * * *